United States Patent [19]
Onodera et al.

[11] Patent Number: 5,537,291
[45] Date of Patent: Jul. 16, 1996

[54] COOLING DEVICE FOR INTEGRATED CIRCUIT ELEMENT

[75] Inventors: Yasushi Onodera; Akira Ueda, both of Kawasaki, Japan

[73] Assignee: Fujitsu Limited, Kanagawa, Japan

[21] Appl. No.: 366,728

[22] Filed: Dec. 30, 1994

[30] Foreign Application Priority Data

Mar. 17, 1994 [JP] Japan .................................. 6-047162

[51] Int. Cl.6 ...................................... H05K 7/20
[52] U.S. Cl. ..................... 361/699; 165/80.4; 257/714
[58] Field of Search ......................... 165/80.4; 257/714, 257/716; 361/688–689, 698–699

[56] References Cited

U.S. PATENT DOCUMENTS 4,870,477  9/1989  Nakanishi et al. ..................... 361/699
5,226,471  7/1993  Stefani ..................................... 165/13

FOREIGN PATENT DOCUMENTS

0246657A2  11/1987  European Pat. Off. .
0302641A1  2/1989  European Pat. Off. .
4255295  9/1992  Japan ..................................... 361/688

Primary Examiner—Gregory D. Thompson
Attorney, Agent, or Firm—Nikaido, Marmelstein, Murray & Oram

[57] ABSTRACT

The cooling device including a cold plate having an inside water passage through which a cooling water passes and having one surface provided with a cooling element corresponding to an integrated circuit element, a housing for fixing the cold plate to a substrate so that the cooling element is kept in close contact with the integrated circuit element, and a water leakage sensor provided inside the housing, is disclosed.

10 Claims, 7 Drawing Sheets

COOLING DEVICE FOR INTEGRATED CIRCUIT ELEMENT

BACKGROUND OF THE INVENTION

1. Field of the Invention

The present invention relates to a cooling device for an integrated circuit element, and more particularly to a cooling device for an integrated circuit element, which can efficiently cool the integrated circuit element by the use of a refrigerant such as water.

2. Description of the Related Art

In recent years, many integrated circuit elements such as LSIs generating a large quantity of heat have been used in the field of large-scale electronic computers, for example, in association with a great increase in operating speed and in processing capacity. The use of a refrigerant such as water is effective for efficient cooling of such integrated circuit elements, and it is desired to provide a cooling device for an integrated circuit element, which can efficiently cool the integrated circuit element with a high reliability by the use of the refrigerant.

A known cooling device applicable to an integrated circuit element mounted on a substrate includes a cold plate having an inside refrigerant passage through which a refrigerant passes and having one surface provided with a cooling element corresponding to the integrated circuit element. The cooling device is used in such a manner that a head portion of the cooling element is kept in close contact with the integrated circuit element. As a technique for detecting leakage of a refrigerant from the cooling device, it is known that a receptacle for receiving a leak of the refrigerant is located under the cooling device and that the refrigerant received by the receptacle is detected by a flow switch or the like.

In the prior art mentioned above, there is a long time difference between the time of generation of the refrigerant leakage and the time of detection of it, causing a possible influence upon the reliability of the integrated circuit element and other electronic parts.

SUMMARY OF THE INVENTION

It is therefore an object of the present invention to provide a cooling device for an integrated circuit element which can detect the refrigerant leakage early and reliably.

According to the present invention, there is provided a cooling device applicable to an integrated circuit element mounted on a substrate, comprising a cold plate having an inside refrigerant passage through which a refrigerant passes and having one surface provided with a cooling element corresponding to said integrated circuit element; a housing for fixing said cold plate to said substrate so that said cooling element is kept in close contact with said integrated circuit element; and a sensor provided inside said housing, for detecting leakage of said refrigerant in said housing.

When the refrigerant is water, a sensor for detecting a change in electric resistance due to deposition of water may be used as the sensor mentioned above. It is to be noted that the following description is applied to the case where the refrigerant is water.

When the integrated circuit element comprises a plurality of integrated circuit elements, the cooling element may also comprise a plurality of cooling elements corresponding to the plurality of integrated circuit elements.

According to the present invention, the sensor for detecting water leakage is provided inside the housing. Therefore, the water leakage can be detected early and reliably. This operation is remarkable particularly when a plurality of integrated circuit elements are provided. That is, particularly when a plurality of cooling elements are provided so as to correspond to the plurality of integrated circuit elements, the present invention has the following advantage over the prior art. When water leaks from one of the cooling elements by any cause, there is a long time difference between the time of generation of the water leakage and the time of detection of it in the prior art. To the contrary, since the sensor is provided inside the housing according to the present invention, the water leakage can be detected early.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

A preferred embodiment of the present invention will now be described in detail with reference to the accompanying drawings.

Figure 1:
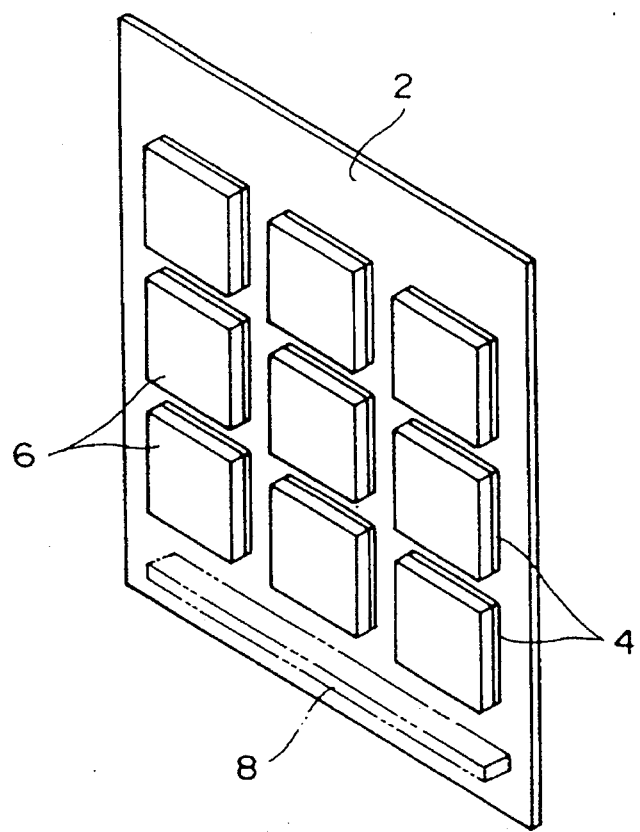
FIG. 1 is a perspective view of a mother board to which the cooling device of the present invention is applicable.

FIG. 1 is a perspective view of a mother board 2 for a large-scale computer to which the present invention is applicable. A plurality of (for example, nine as shown) module substrates 4 are mounted on the mother board 2, and a plurality of integrated circuit elements are mounted on each module substrate 4. A cooling device 6 is mounted on each module substrate 4, so as to cool the integrated circuit elements. As similar to the conventional technique mentioned above, a receptacle 8 as shown by a phantom line is provided at a lower portion of the mother board 2 as a technique for detecting water leakage in the mother board 2.

In this preferred embodiment, however, a water leakage sensor is contained in each cooling device 6 and the receptacle 8 is not provided.

Figure 2:
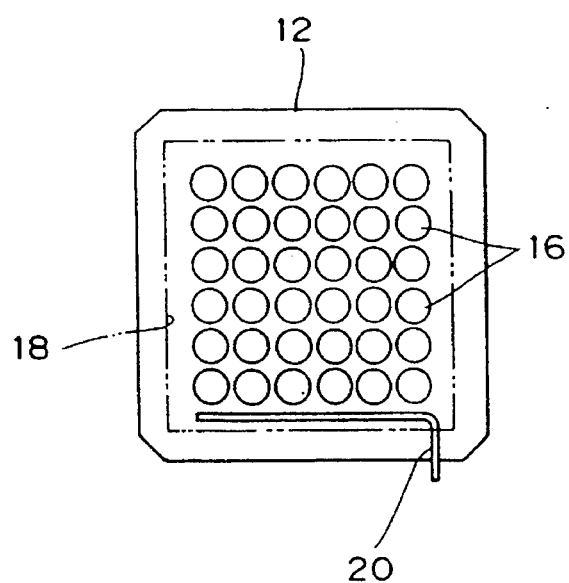
FIG. 2 is an elevational view of an essential part of the cooling device, showing a first preferred embodiment of the present invention.
Figure 3:
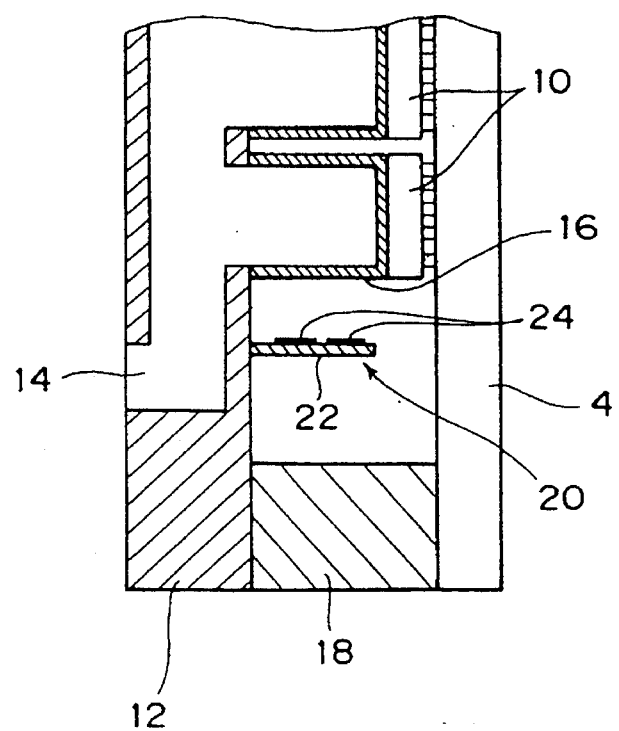
FIG. 3 is a sectional view of the cooling device, showing the first preferred embodiment of the present invention.

FIG. 2 is an elevational view of an essential part of the cooling device, showing a first preferred embodiment of the present invention, and FIG. 3 is a sectional view of the cooling device shown in FIG. 2. As best shown in FIG. 3, a plurality of integrated circuit elements 10 are mounted on a surface of the module substrate 4. Reference numeral 12 denotes a cold plate as a cooling member. The cold plate 12 has a water passage 14 through which a cooling water passes. A plurality of cooling elements 16 are provided on one surface of the cold plate 12 so as to respectively correspond to the plurality of integrated circuit elements 10.

The cold plate 12 is fixed to the substrate 4 by a housing 18 in such a manner that a head portion of each cooling element 16 is in close contact with the corresponding integrated circuit element 10. The housing 18 is configured like a frame, for example, along the outer peripheral edges of the substrate 4 and the cold plate 12. The water passage 14 communicates with the inside of each cooling element 16, so that the cooling water passing through the water passage 14 can efficiently cool each integrated circuit element 10. Some specific structures of the cooling element 16 will be described later in other preferred embodiments of the present invention.

As best shown in FIG. 2, the plurality of cooling elements 16 are arranged on the cold plate 12, and a sensor 20 is contained in the housing 18 so as to be positioned under the cooling elements 16. In this preferred embodiment, water is used as a refrigerant. Accordingly, a sensor capable of detecting a change in electric resistance due to deposition of water may be adopted as the sensor 20. As shown in FIG. 3, the sensor 20 includes a strip-shaped insulator substrate 22 fixed to the cold plate 12 and at least two conductor patterns 24 formed on a surface of the insulator substrate 22 opposed to the cooling elements 16. With this arrangement, the deposition of water to the sensor 20 can be detected according to a difference in impedance between the two conductor patterns 24. According to this preferred embodiment, the sensor 20 is provided inside the housing 18. Therefore, the time from occurrence of water leakage to detection of the water leakage can be greatly reduced as compared with that by the conventional technique.

Figure 4:
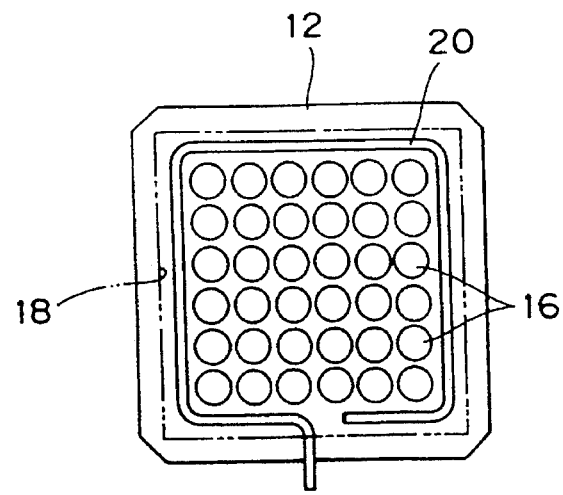
FIG. 4 is an elevational view of an essential part of the cooling device, showing a second preferred embodiment of the present invention.

FIG. 4 is an elevational view of an essential part of the cooling device, showing a second preferred embodiment of the present invention. This preferred embodiment is characterized in that the sensor 20 is so arranged as to surround all the cooling elements 16. The sensor 20 having a sectional shape as shown in FIG. 3 is suitable for the arrangement of the sensor as in the second preferred embodiment. In the first preferred embodiment, the sensor 20 must be positioned under the cooling elements 16 to detect the water leakage from the cooling elements 16. Accordingly, the direction of the cooling device is limited in mounting the cooling device on the substrate 4 shown in FIG. 1. In contrast therewith, the direction of the cooling device in the second preferred embodiment is not limited because of the arrangement of the sensor 20 shown in FIG. 4. The mounting of the cooling device may be effected by a usual method using screws or the like.

Figure 5:
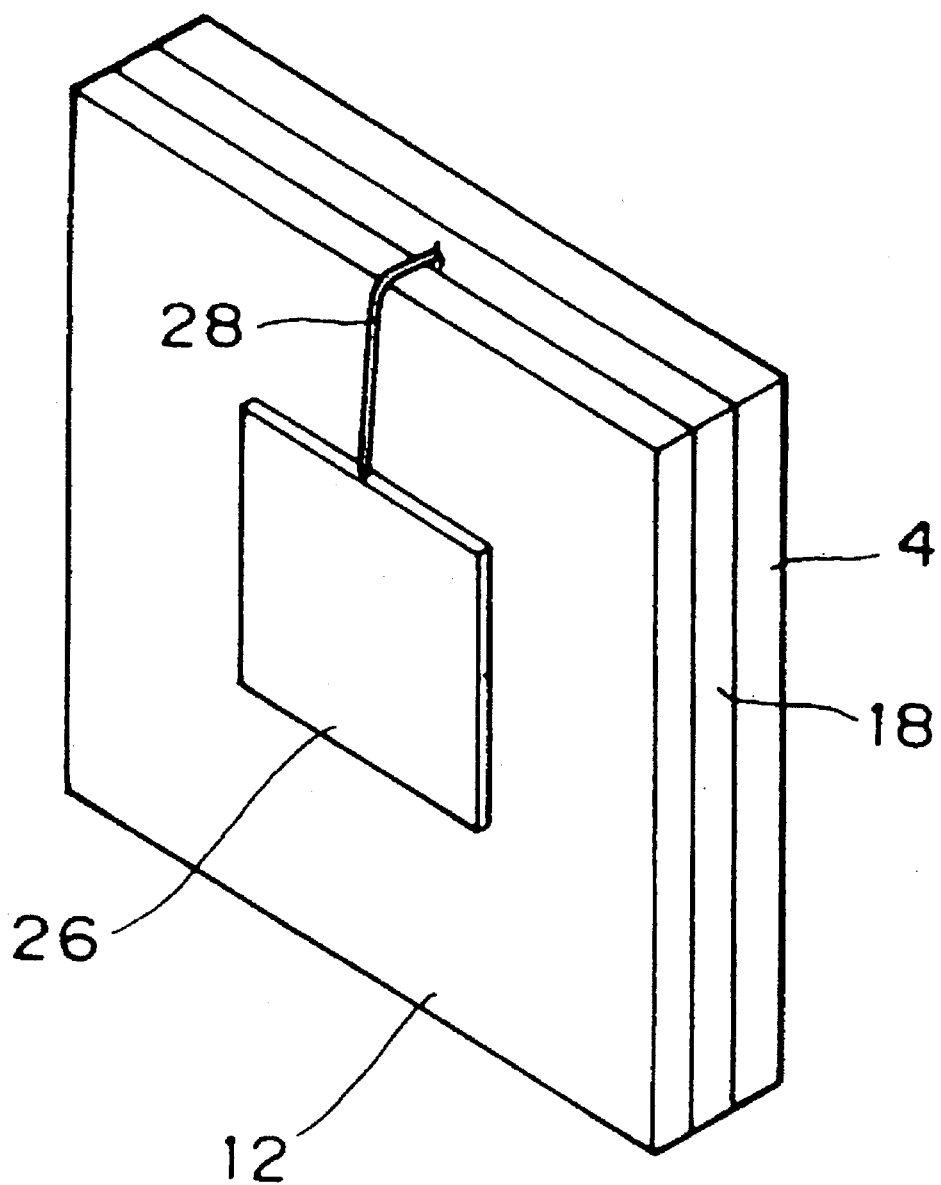
FIG. 5 is a perspective view of the cooling device, showing a third preferred embodiment of the present invention.

FIG. 5 is a perspective view of the cooling device, showing a third preferred embodiment of the present invention. The cooling device in this preferred embodiment is provided with a circuit board 26 for determining whether or not water leakage has occurred, according to a detection output from the sensor mentioned above. The circuit board 26 is mounted on an outer surface of the cold plate 12, for example. Reference numeral 28 denotes a signal line for supplying a determination output from the circuit board 26 to an external circuit. A circuit realized by the circuit board 26 includes, for example, means for converting the impedance between the conductor patterns 24 of the sensor 20 (see FIG. 3) into a voltage signal and means for comparing the voltage signal with a predetermined reference voltage. In this case, whether or not the water leakage has occurred is determined according to the result of comparison between the voltage signal and the reference voltage. According to this preferred embodiment, an alarm device or the like can be easily realized by collecting determination outputs from all cooling devices. Accordingly, wiring and connection for alarm or the like in the mother board 2 (see FIG. 1) can be minimized.

Figure 6:
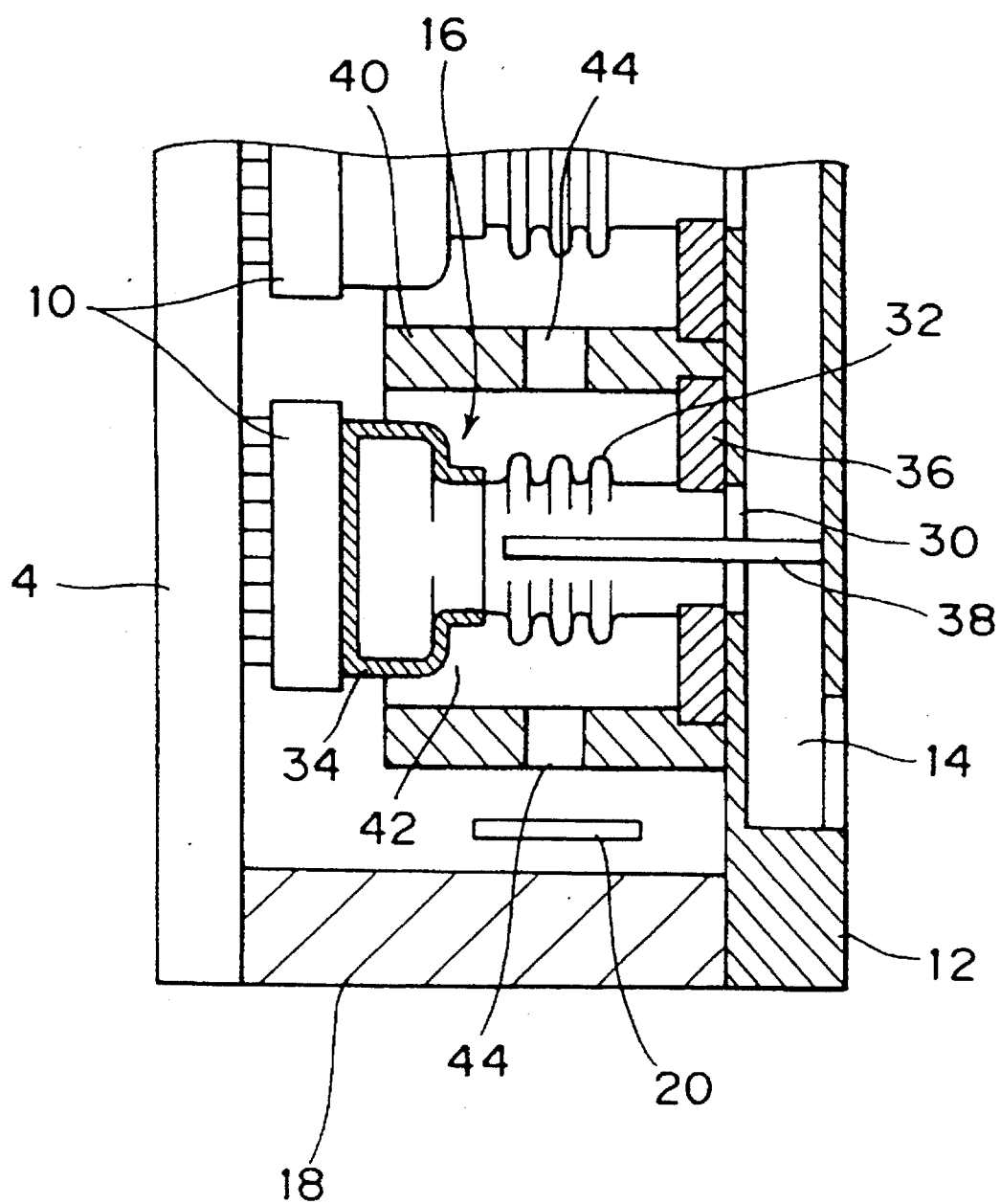
FIG. 6 is a sectional view of the cooling device, showing a fourth preferred embodiment of the present invention.

FIG. 6 is a sectional view of the cooling device, showing a fourth preferred embodiment of the present invention. Reference numerals 30 denote a plurality of openings formed through the surface of the cold plate 12 on the substrate 4 side. The plurality of openings 30 are so formed as to respectively correspond to the plurality of integrated circuit elements 10. Each cooling element 16 is composed of a flexible bellows 32 and a heat transfer cap 34 kept in close contact with the corresponding integrated circuit element 10. A first end of the bellows 32 is connected at the corresponding opening 30 through a flange 36 to the cold plate 12, and a second end of the bellows 32 is closed by the heat transfer cap 34. Since each cooling element 16 has the bellows 32, the heat transfer cap 34 can be always kept in close contact with the corresponding integrated circuit element 10 regardless of variations in mounting height among the integrated circuit elements 10. Further, the water passage 14 of the cold plate 12 is provided with a plurality of guide plates 38 respectively projecting into the cooling elements 16 in order that the cooling water flowing in the water passage 14 can be well guided into the cooling elements 16.

Figure 7A:
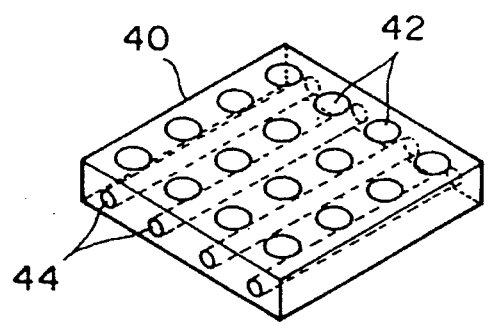
FIG. 7A, 7B and 7C are perspective views showing embodiments of a guide block.

The cooling device has a guide block 40 as shown in FIG. 7A, so as to easily position the cooling elements 16 in the plane of the substrate 4 in mounting the cooling device on the substrate 4. The guide block 40 has a plurality of vertical holes 42 for respectively receiving the plurality of cooling elements 16. The guide block 40 further has a plurality of horizontal holes 44 providing communication of the vertical holes 42 in one direction. The reason why the horizontal holes 44 are formed in the guide block 40 is that when water leakage occurs at the bellows 32, for example, in any of the cooling elements 16, the leak of water is intended to reach the sensor 20 as early as possible. Each vertical hole 42 of the guide block 40 is formed at its one end with a shoulder adapted to be fitted with the flange 36 of each cooling element 16. With this arrangement, the cooling device can be easily constructed only by mounting the guide block 40 having assembled the cooling elements 16 on the cold plate 12 rather than by individually fixing the cooling elements 16 to the cold plate 12.

Figure 7B:
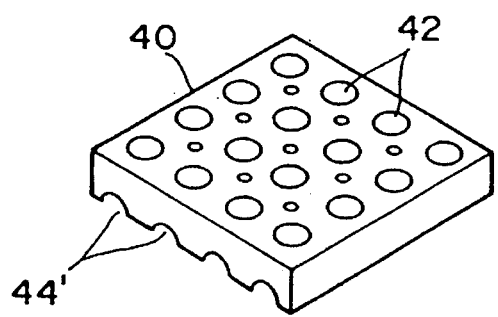
Figure 7C:
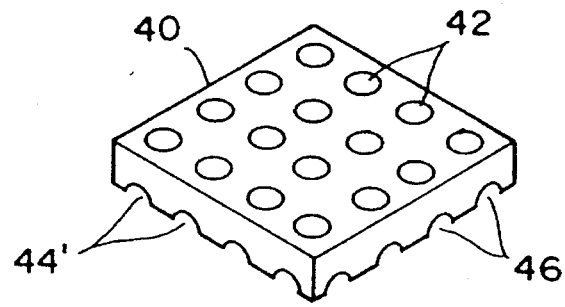

Although each horizontal hole 44 is formed at an intermediate position of the corresponding vertical hole 42 of the guide block 40 in its height as shown in FIG. 6, a plurality of semicylindrical horizontal holes (grooves) 44' may be formed on one surface of the guide block 40 on the cold plate 12 side as shown in FIG. 7B. Although the horizontal holes 44' extend in one direction as shown in FIG. 7B, a plurality of similar horizontal holes 46 may be additionally formed so as to extend in another direction perpendicular to the direction of extension of the horizontal holes 44' as shown in FIG. 7C.

Figure 8:
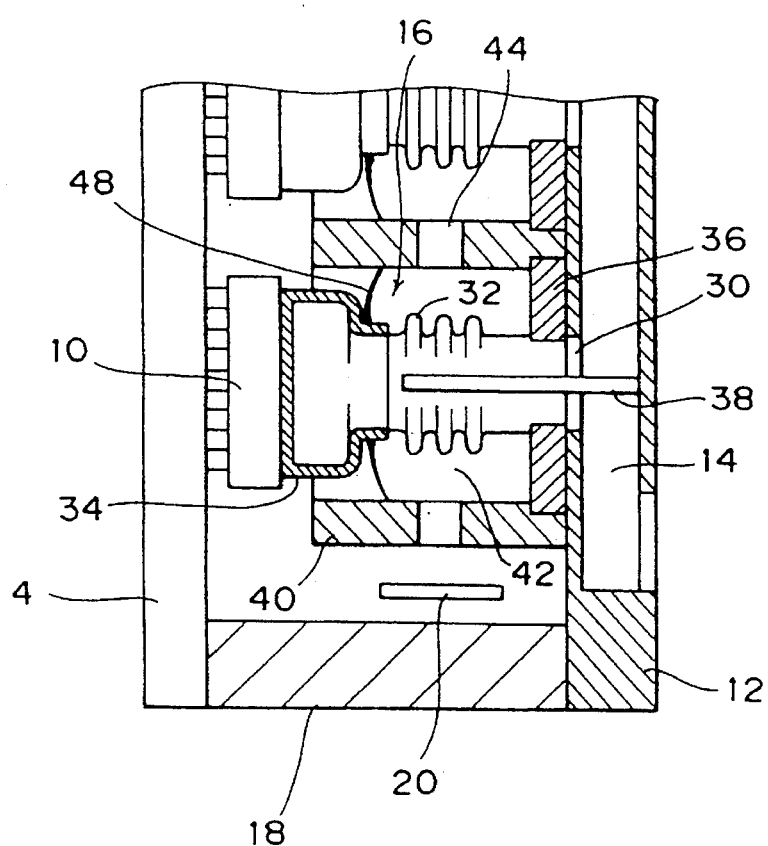
FIG. 8 is a sectional view of the cooling device, showing a fifth preferred embodiment of the present invention.
Figure 9:
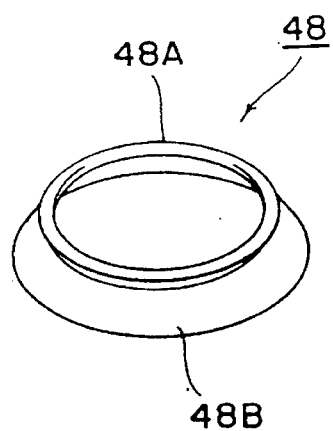
FIG. 9 is a perspective view of a sealing member.

FIG. 8 is a sectional view of the cooling device, showing a fifth preferred embodiment of the present invention. In contrast with the fourth preferred embodiment shown in FIG. 6, the fifth preferred embodiment is characterized in that a sealing member 48 is provided at an intermediate portion of each cooling element 16. As shown in FIG. 9, the sealing member 48 is composed of, for example, a ring-shaped inner circumferential portion 48A and a relatively thin outer circumferential portion 48B integrally formed with the inner circumferential portion 48A. The sealing member 48 is formed of rubber, for example. Each sealing member 48 is positioned between the corresponding horizontal holes 44 of the guide block 40 and the corresponding integrated circuit element 10. The inner circumferential portion 48A is closely fitted with the corresponding cooling element 16, and the outer circumferential portion 48B is closely fitted with the corresponding vertical hole 42 of the guide block 40.

Thus, the sealing member 48 is located between each cooling element 16 and the corresponding vertical hole 42 of the guide block 40, thereby preventing a leak of water from reaching the corresponding integrated circuit element 10 (i.e. head portion) in the event that the water leakage occurs at the bellows 32 (i.e. base portion) where the leakage most possibly occurs, or at a joint portion between the bellows 32 and the cold plate 12. As the water leakage hardly occurs at the heat transfer cap 34 itself of each cooling element 16, it is preferable to hold each sealing member 48 in contact with the corresponding heat transfer cap 34. In this case, the heat transfer cap 34 may be formed with a groove to be fitted with the inner circumferential portion 48A of each sealing member 48 in order to prevent movement of the sealing member 48 in the longitudinal direction of the cooling element 16.

Figure 10:
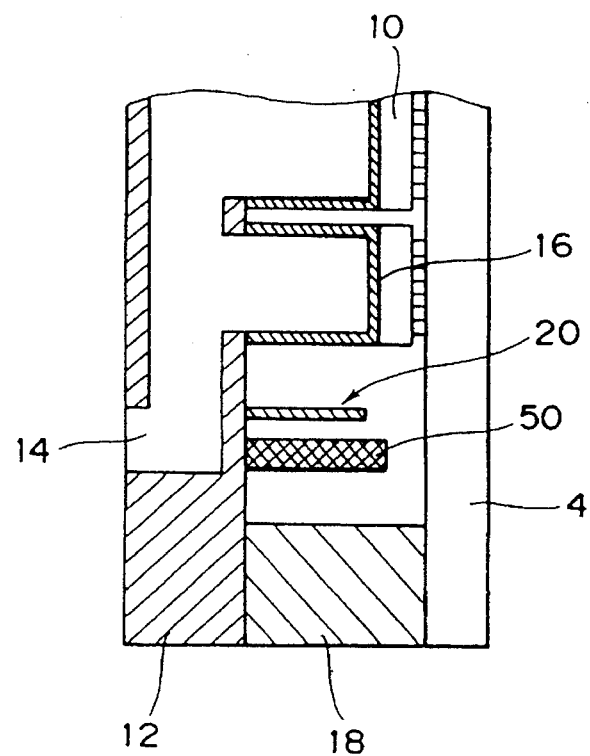
FIG. 10 is a sectional view of the cooling device, showing a sixth preferred embodiment of the present invention.

FIG. 10 is a sectional view of the cooling device, showing a sixth preferred embodiment of the present invention. In contrast with the first preferred embodiment shown in FIG. 3, the sixth preferred embodiment is characterized in that a water absorptive filler 50 is provided between the sensor 20 and the housing 18. The filler 50 is formed from a water absorptive sheet using high-molecular polymer, for example. The use of the filler 50 provides an advantage such that a leak of water can be temporarily absorbed by the filler 50, thereby preventing the cooling water from leaking out of the module to damage various parts on the mother board or the like.

Figure 11:
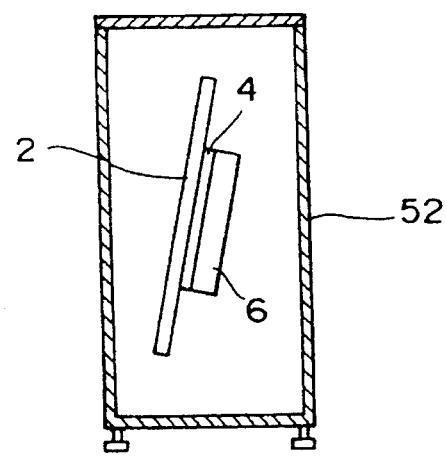
FIG. 11 is a sectional view of a machine, showing a seventh preferred embodiment of the present invention.

FIG. 11 is a sectional view of a machine such as an electronic computer, showing a seventh preferred embodiment of the present invention. In this preferred embodiment, the mother board 2 as shown in FIG. 1 is inclined in a predetermined direction in storing the mother board 2 in a locker 52, for example. More specifically, the substrate 4 on which the integrated circuit elements to be cooled by the cooling device 6 are mounted is inclined to its mounting surface for the integrated circuit elements. With this arrangement, even when water leakage occurs in the cooling device, a lead of water can be prevented from reaching the integrated circuit elements.

As described above, the present invention has an effect that it is possible to provide a cooling device for an integrated circuit element which can detect refrigerant leakage early and reliably.

While the invention has been described with reference to particular embodiments, these embodiments are given by way of illustration only and not limitative of the present invention. The scope of the invention is defined by the appended claims and all changes and modifications as fall within the equivalence of the scope of the claims are therefore to be embraced by the invention.

What is claimed is:

1. A cooling device applicable to an integrated circuit element mounted on a substrate, said cooling device comprising:

a cold plate having an inside refrigerant passage through which a refrigerant passes and having one surface provided with a cooling element located corresponding to an integrated circuit element mounted on a substrate;

a housing for fixing said cold plate to said substrate so that said cooling element is kept in close contact with said integrated circuit element; and a sensor, provided inside said housing, for detecting leakage of said refrigerant in said housing by detecting a charge in electrical impedance due to deposition of said refrigerant.

2. A cooling device according to claim 1, wherein:

said cold plate further has an opening communicating with said refrigerant passage; and said cooling element comprises a bellows having a first end communicating with said opening and a heat transfer member for closing a second end of said bellows, said heat transfer member being kept in close contact with said integrated circuit element.

3. A cooling device according to claim 1, wherein said refrigerant is water, said sensor includes a strip-shaped insulator substrate fixed to said cold plate and at least two conductor patterns formed on a surface of said insulator substrate, and said sensor detects a change in electric resistance between said conductor patterns due to deposition of water.

4. A cooling device according to claim 1, further comprising a circuit board having a means for determining whether or not water leakage has occurred based upon a detection output from said sensor.

5. A cooling device according to claim 1, wherein said integrated circuit element comprises a plurality of integrated circuit elements, and said cooling element comprises a plurality of cooling elements.

6. A cooling device according to claim 5, wherein said sensor is so arranged as to surround said plurality of cooling elements.

7. A cooling device according to claim 5, further comprising a guide block mounted in said housing, said guide block having a plurality of vertical holes for respectively receiving said plurality of cooling elements, said guide block further having a plurality of horizontal holes for providing communication between said vertical holes.

8. A cooling device according to claim 7, further comprising a sealing member, provided at an intermediate portion of each cooling element, for partitioning each of said vertical holes into a space corresponding to a head portion of each said cooling element and a space corresponding to a base portion of each said cooling element.

9. A cooling device according to claim 1, further comprising a water absorptive filler provided between said sensor and said housing.

10. A cooling device according to claim 1, wherein said substrate is inclined to its one surface on which said integrated circuit element is mounted.

* * * * *